United States Patent
Pak et al.

(10) Patent No.: US 7,548,228 B2
(45) Date of Patent: Jun. 16, 2009

(54) GATE DRIVER CIRCUIT AND DISPLAY DEVICE HAVING THE SAME

(75) Inventors: Sang-Jin Pak, Yongin-si (KR); Myung-Woo Lee, Suwon-si (KR); Hyung-Guel Kim, Yongin-si (KR); Kee-Han Uh, Yongin-si (KR); Dong-Jin Jeong, Seoul (KR); Joo-Hyung Lee, Gwacheon-si (KR)

(73) Assignee: Samsung Electronics Co., Ltd. (KR)

( * ) Notice: Subject to any disclaimer, the term of this patent is extended or adjusted under 35 U.S.C. 154(b) by 745 days.

(21) Appl. No.: 11/289,161

(22) Filed: Nov. 29, 2005

(65) Prior Publication Data

US 2006/0221040 A1 Oct. 5, 2006

(30) Foreign Application Priority Data

Mar. 30, 2005 (KR) .................. 10-2005-0026461

(51) Int. Cl.
*G09G 5/00* (2006.01)
(52) U.S. Cl. ...................................... 345/100
(58) Field of Classification Search .......... 345/98, 345/100
See application file for complete search history.

(56) References Cited

U.S. PATENT DOCUMENTS

| | | | | |
|---|---|---|---|---|
| 5,136,622 A | * | 8/1992 | Plus | 377/64 |
| 5,852,428 A | * | 12/1998 | Ishikawa et al. | 345/100 |
| 5,907,314 A | * | 5/1999 | Negishi et al. | 345/103 |
| 6,124,853 A | * | 9/2000 | Palalau et al. | 345/212 |
| 6,232,939 B1 | * | 5/2001 | Saito et al. | 345/93 |
| 6,323,871 B1 | * | 11/2001 | Fujiyoshi et al. | 345/598 |
| 6,876,352 B1 | * | 4/2005 | Sato et al. | 345/100 |
| 6,924,786 B2 | * | 8/2005 | Hebiguchi | 345/103 |
| 7,170,505 B2 | * | 1/2007 | Akahori | 345/204 |
| 7,233,308 B2 | * | 6/2007 | Park | 345/100 |
| 2004/0189585 A1 | * | 9/2004 | Moon | 345/100 |
| 2005/0156856 A1 | * | 7/2005 | Jang et al. | 345/100 |

\* cited by examiner

*Primary Examiner*—Richard Hjerpe
*Assistant Examiner*—Nelson Lam
(74) *Attorney, Agent, or Firm*—Cantor Colburn LLP (57) ABSTRACT

The first shift register applies (4n−3)-th and (4n−2)-th gate signals to (4n−3)-th and (4n−2)-th gate lines, respectively, in response to a first clock signal, a second clock signal having a delayed phase by 1H time with respect to the first clock signal, and a third clock signal having opposite phase to the first clock signal. The second shift register applies (4n−1)-th and 4n-th gate signals to (4n−1)-th and 4n-th gate lines, respectively, in response to the first clock signal, the third clock signal, and a fourth clock signal having opposite phase to the second clock signal. Therefore, a number of transistors in the first and second shift registers may be reduced.

33 Claims, 5 Drawing Sheets

GATE DRIVER CIRCUIT AND DISPLAY DEVICE HAVING THE SAME

This application claims priority to Korean Patent Application No. 2005-26461, filed on Mar. 30, 2005 and all the benefits accruing therefrom under 35 U.S.C. §119, and the contents of which in its entirety are herein incorporated by reference.

BACKGROUND OF THE INVENTION

1. Field of the Invention

The present invention relates to a gate driver circuit and a display device having the gate driver circuit. More particularly, the present invention relates to a gate driver circuit capable of reducing a size thereof and a display device having the gate driver circuit.

2. Description of the Related Art

A liquid crystal display ("LCD") device includes an LCD panel. The LCD panel includes an array substrate, a color filter substrate facing the array substrate, and a liquid crystal layer disposed between the array substrate and the color filter substrate. The array substrate includes a plurality of gate lines transferring gate signals, and a plurality of data lines transferring data signals. The data lines cross over the gate lines and are insulated from the gate lines.

The LCD device further includes a gate driver circuit outputting the gate signals to the gate lines and a data driver circuit outputting the data signals to the data lines. In general, the gate driver circuit or the data driver circuit is formed in a chip mounted on the LCD panel.

The gate driver circuit is formed directly on the LCD panel in order to reduce a size of the LCD device and enhance productivity.

The gate driver circuit formed on the LCD panel includes a shift register having a plurality of stages electrically connected to each other. As a size of the LCD device increases, the gate driver circuit must include two shift registers disposed at first and second end portions of the gate lines, respectively. The two shift registers output gate signals alternately to the gate lines.

The stages include a plurality of transistors and a plurality of capacitors. A number of the transistors determines a size of the gate driver circuit. Furthermore, when the LCD panel includes two shift registers, a number of transistors forming a stage further increases, thus a gate driver circuit having two shift registers with an increased number of transistors per stage increases in size. Therefore, an LCD device must also increase in size to accommodate the gate driver circuit.

BRIEF SUMMARY OF THE INVENTION

The ability to decrease the size of the gate driver circuit and thus the display device would be desirable. Thus, the present invention provides a gate driver circuit capable of reducing a size thereof.

The present invention also provides a display device having the above gate driver circuit.

In exemplary embodiments of a gate driver circuit according to the present invention, the gate driver circuit includes a first shift register and a second shift register. The first shift register includes a plurality of first stages. The first shift register applies a (4n−3)-th gate signal and a (4n−2)-th gate signal to a (4n−3)-th gate line and a (4n−2)-th gate line, respectively, in response to a first clock signal, a second clock signal, and a third clock signal. The second clock signal has a delayed phase by 1H time with respect to the first clock signal, and the third clock signal has an opposite phase to the first clock signal. The second shift register includes a plurality of second stages. The second shift register applies a (4n−1)-th gate signal and a 4n-th gate signal to a (4n−1)-th gate line and a 4n-th gate line, respectively, in response to the first clock signal, the third clock signal, and a fourth clock signal. The fourth clock signal has an opposite phase to the second clock signal. Here, n denotes a natural number.

In exemplary embodiments of a display device according to the present invention, the display device includes a display panel, a gate driver circuit, and a data driver circuit. The display panel displays an image in response to a gate signal and a data signal. The gate driver circuit outputs the gate signal, and the data driver circuit outputs the data signal. The gate driver circuit includes a first shift register and a second shift register. The first shift register includes a plurality of first stages. The first shift register applies a (4n−3)-th gate signal and a (4n−2)-th gate signal to a (4n−3)-th gate line and a (4n−2)-th gate line, respectively, in response to a first clock signal, a second clock signal, and a third clock signal. The second clock signal has a delayed phase by 1H time with respect to the first clock signal, and the third clock signal has an opposite phase to the first clock signal. The second shift register includes a plurality of second stages. The second shift register applies a (4n−1)-th gate signal and a 4n-th gate signal to a (4n−1)-th gate line and a 4n-th gate line, respectively, in response to the first clock signal, the third clock signal, and a fourth clock signal. The fourth clock signal has an opposite phase to the second clock signal.

In other exemplary embodiments of a display device according to the present invention, the display device includes a display panel including a plurality of gate lines each having a first end and a second end. A first shift register responds to a first clock signal and a second clock signal on the first end of the gate lines, and responds to a third clock signal on the second end of the gate lines. A second shift register responds to the third clock signal and a fourth clock signal on the second end of the gate lines, and responds to the first clock signal on the first end of the gate lines.

Therefore, a number of transistors within the first and second shift registers may be decreased to reduce a size of the first and second shift registers. Additionally, a space of the array substrate may be used efficiently, so that an area of the array substrate, where the gate driver circuit is formed, may be reduced.

BRIEF DESCRIPTION OF THE DRAWINGS

The above and other features and advantages of the present invention will become more apparent by describing in detailed exemplary embodiments thereof with reference to the accompanying drawings, in which.

DETAILED DESCRIPTION OF THE INVENTION

It should be understood that the exemplary embodiments of the present invention described below may be varied modified in many different ways without departing from the inventive principles disclosed herein, and the scope of the present invention is therefore not limited to these particular flowing embodiments. Rather, these embodiments are provided so that this disclosure will be thorough and complete, and will fully convey the concept of the invention to those skilled in the art by way of example and not of limitation.

Hereinafter, the embodiments of the present invention will be described in detail with reference to the accompanied drawings. Like numerals refer to like elements throughout.

Figure 1:
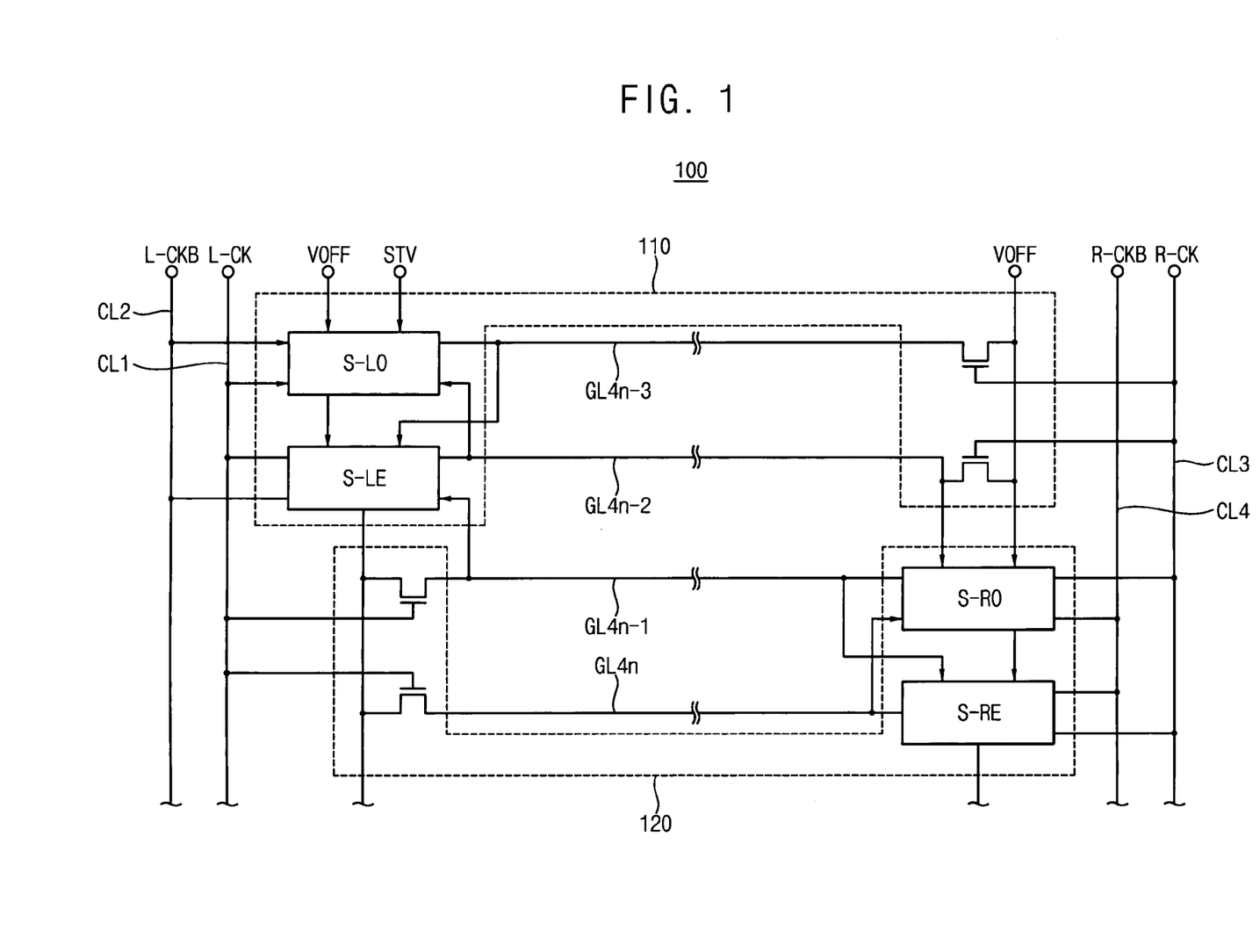
FIG. 1 is a block diagram illustrating an exemplary embodiment of a gate driver circuit according to the present invention.
Figure 2:
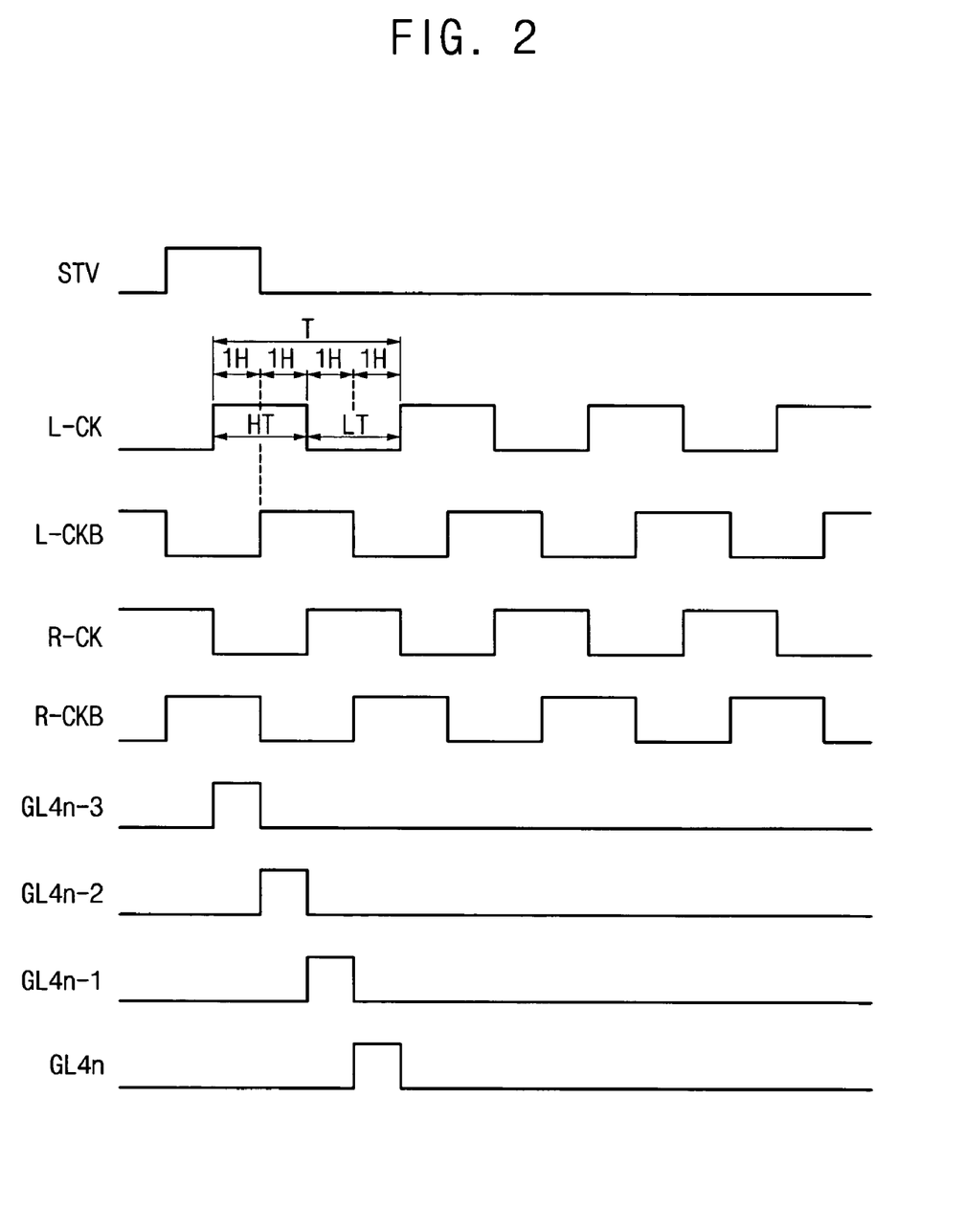
FIG. 2 is a timing diagram illustrating input and output of the gate driver circuit in FIG. 1.

FIG. 1 is a block diagram illustrating an exemplary embodiment of a gate driver circuit according to the present invention, and FIG. 2 is a timing diagram illustrating input and output of the gate driver circuit in FIG. 1.

Referring to FIG. 1, a gate driver circuit 100 includes a first shift register 110 and a second shift register 120.

The first shift register 110 includes a plurality of left, or first, stages S-LO and S-LE applying a (4n–3)-th gate signal and a (4n–2)-th gate signal to a (4n–3)-th gate line GL4n–3 and a (4n–2)-th gate line GL4n–2, respectively, and the second shift register 120 includes a plurality of right, or second, stages S-RO and S-RE applying a (4n–1)-th gate signal and a 4n-th gate signal to a (4n–1)-th gate line GL4n–1 and a 4n-th gate line GL4n, respectively, wherein 'n' represents a natural number. In other words, 'n' is a positive integer.

The first shift register 110 receives a scan start signal STV, a first clock signal L-CK, a second clock signal L-CKB, a third clock signal R-CK, and an off-voltage Voff. The second shift register 120 receives the first clock signal L-CK, the third clock signal R-CK, a fourth clock signal R-CKB, and the off-voltage Voff. A first clock wiring CL1 and a second clock wiring CL2 transferring the first and second clock signals L-CK and L-CKB are adjacent to the first shift register 110. A third clock wiring CL-3 and a fourth clock wiring CL-4 transferring the third and fourth clock signals R-CK and R-CKB are adjacent to the second shift register 120. The clock wirings may run generally perpendicular to the gate lines as shown.

Right transistors of the first shift register 110 receiving the third clock signal R-CK are adjacent to the third clock wiring CL-3. Left transistors of the second shift register 120 receiving the first clock signal L-CK are adjacent to the first clock wiring CL-1. A position of the left and right transistors will be explained further below with reference to FIGS. 3 and 4.

Referring to FIG. 2, each of the first, second, third, and fourth clock signals L-CK, L-CKB, R-CK, and R-CKB has a time period of 4H. It should be understood that "H" represents a unit of the horizontal period, e.g. "1H" is equal to one period of a gate clock signal. In detail, each of the first, second, third, and fourth clock signals L-CK, L-CKB, R-CK, and R-CKB has a high state or level for 2H time, and a low state or level for 2H time. A phase of the second clock signal L-CKB is delayed by 1H time with respect to a phase of the first clock signal L-CK. The third clock signal R-CK has an opposite phase to that of the first clock signal L-CK and is delayed by 1H time with respect to a phase of the second clock signal L-CKB, and the fourth clock signal R-CKB has an opposite phase to that of the second signal L-CKB and is delayed by 1H time with respect to a phase of the third clock signal R-CK.

The odd-numbered left stages S-LO apply the (4n–3)-th gate signal to the (4n–3)-th gate line GL4n–3 for 1H time in response to the first clock signal L-CK. After 1H time has passed, the odd numbered left stage S-LO pulls down a voltage of the (4n–3)-th gate line GL4n–3 to be the off-voltage Voff in response to the second clock signal L-CKB. Then, the odd numbered left stages maintain the (4n–3)-th gate signal to be the off-voltage Voff in response to the first and third clock signals L-CK and R-CK.

The even-numbered left stages S-LE apply the (4n–2)-th gate signals to the (4n–2)-th gate line GL4n–2 for 1H time in response to the second clock signal L-CKB. After 1H time has passed, the even numbered left stage S-LE pulls down a voltage of the (4n–2)-th gate line GL4n–2 to be the off-voltage Voff in response to the third clock signal R-CK. Then, the even numbered left stages maintain the (4n–2)-th gate signal to be the off-voltage Voff in response to the first and third clock signals L-CK and R-CK.

The odd-numbered right stages S-RO apply the (4n–1)-th gate signals to the (4n–1)-th gate lines GL4n–1 for 1H time in response to the third clock signal R-CK. After 1H time has passed, the odd numbered right stage S-RO pulls down a voltage of the (4n–1)-th gate lines GL4n–1 to be the off-voltage Voff in response to the fourth clock signal R-CKB. Then, the odd numbered right stages maintain the (4n–1)-th gate signals to be the off-voltage Voff in response to the first and third clock signals L-CK and R-CK.

The even-numbered right stages S-RE apply the 4n-th gate signals to the 4n-th gate lines GL4n for 1H time in response to the fourth clock signal R-CKB. After 1H time has passed, the even numbered right stage S-RE pulls down a voltage of the 4n-th gate lines GL4n to be the off-voltage Voff in response to the fourth clock signal R-CKB. Then, the even numbered right stages maintain the 4n-th gate signals to be the off-voltage Voff in response to the first and third clock signals L-CK and R-CK.

Figure 3:
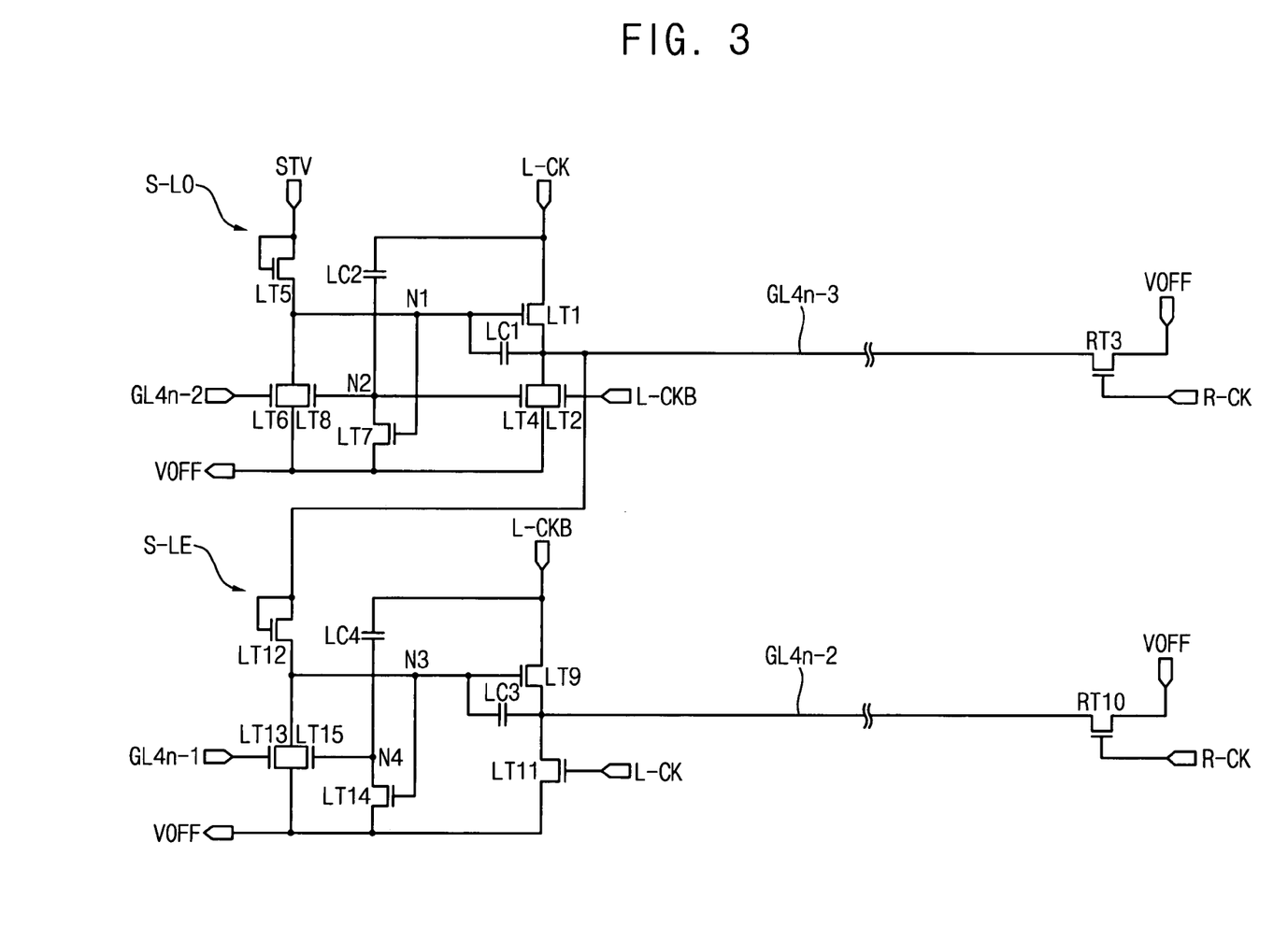
FIG. 3 is a circuit diagram illustrating an odd-numbered left stage and an even numbered left stage in FIG. 1.

FIG. 3 is a circuit diagram illustrating an odd-numbered left stage and an even numbered left stage in FIG. 1.

Referring to FIG. 3, it should be understood that while only one odd numbered left stage S-LO and one even numbered left stage S-LE are illustrated, the first shift register 110 may include a plurality of odd and even numbered left stages S-LO and S-LE. The odd numbered left stages S-LO include a first left transistor LT1, a second left transistor LT2, fourth, fifth, sixth, seventh, and eighth transistors LT4, LT5, LT6, LT7, and LT8, a third right transistor RT3, a first left capacitor LC1, and a second left capacitor LC2. The even numbered left stages S-LE include a ninth left transistor LT9, eleventh, twelfth, thirteenth, fourteenth, and fifteenth left transistors LT11, LT12, LT13, LT14, and LT15, a tenth right transistor RT10, a third left capacitor LC3, and a fourth left capacitor LC4.

The first, second, fourth, fifth, sixth, seventh, and eighth left transistors LT1, LT2, and LT4 through LT8, and the first and second left capacitors LC1 and LC2 are adjacent to a first end of the (4n–3)-th gate lines GL4n–3. The third right transistor RT3 is adjacent to a second end of the (4n–3)-th gate lines GL4n–3. The ninth and eleventh through fifteenth left transistors LT9, LT11 through LT15, and the third and fourth left capacitors LC3 and LC4 are adjacent to a first end of the (4n–2)-th gate lines GL4n–2. The tenth right transistor RT10 is adjacent to a second end of the (4n–2)-th gate lines GL4n–2.

The first left transistor LT1 includes a gate electrode that is electrically connected to a first node N1, a drain electrode that receives the first clock signal L-CK, and a source electrode that is electrically connected to the (4n−3)-th gate lines GL4n−3. The second left transistor LT2 includes a gate electrode that receives the second clock signal L-CKB, a drain electrode that is electrically connected to the (4n−3)-th gate lines, and a source electrode that receives the off-voltage Voff.

The first left transistor LT1 applies the first clock signal L-CK of high level to the (4n−3)-th gate line GL4n−3 in response to a voltage of the first node N1. The second left transistor LT2 pulls down a voltage of the (4n−3)-th gate line GL4n−3 to be the off-voltage Voff in response to the second clock signal L-CKB of high level, so that the (4n−3)-th gate line GL4n−3 is discharged to be the off-voltage Voff.

The third right transistor RT3 includes a gate electrode that receives the third clock signal R-CK, a drain electrode that is electrically connected to the (4n−3)-th gate line GL4n−3, and a source electrode that receives the off-voltage Voff. The fourth left transistor LT4 includes a gate electrode that is electrically connected to the second node N2, a drain electrode that is electrically connected to the (4n−3)-th gate line GL4n−3, and a source electrode that receives the off-voltage Voff. The drain electrode of the fourth left transistor LT4 may be electrically connected to or the same drain electrode of the second left transistor LT2, and the source electrode of the fourth left transistor LT4 may be electrically connected to or the same drain electrode of the second left transistor LT2. The first clock signal L-CK is applied to the second node N2.

When the third clock signal R-CK is changed from a low level to a high level, the third right transistor RT3 applies the off-voltage Voff to the (4n−3)-th gate lines GL4n−3 in response to the third clock R-CK signal of high level. As a result, a voltage of the (4n−3)-th gate lines becomes the off-voltage Voff for a time period of 2H. Then, when the third clock signal R-CK is changed from a high level to a low level, the first clock signal L-CK is changed from a low level to a high level. Therefore, the fourth left transistor LT4 applies the off-voltage Voff to the (4n−3)-th gate lines GL4n−3 in response to the first clock signal L-CK of high level.

Therefore, even when the third clock signal R-CK is changed to be in a low level, the (4n−3)-th gate signal is maintained to be the off-voltage Voff for 2H time in response to the first clock signal L-CK. In other words, the (4n−3)-th gate signal is maintained to be the off-voltage Voff by the first and third clock signals L-CK and R-CK having opposite phase to each other.

The fifth left transistor LT5 includes a gate electrode, a drain electrode, and a source electrode that is electrically connected to the first node N1. The gate and drain electrodes of the fifth left transistor LT5 are electrically connected to each other, and the scan start signal STV is applied to the gate and drain electrodes of the fifth left transistor LT5. The first left capacitor LC1 includes a first terminal that is electrically connected to the gate electrode of the first left transistor LT1, and a second terminal that is electrically connected to the source electrode of the first left transistor LT1.

When the scan start signal STV is applied to the first node N1 through the fifth left transistor LT5, the first left transistor LT1 is turned on via the gate electrode of the first left transistor LT1, in response to the scan start signal STV. The fifth left transistor LT5 electrically charges the first left capacitor LC1 in response to the scan start signal STV. As a result, the first clock signal L-CK of high level is applied to the (4n−3)-th gate line GL4n−3 as the (4n−3)-th gate signal through the first left transistor LT1. Alternatively, if n>1, the fifth left transistor LT5 may receive a gate signal from a previous gate line.

The sixth left transistor LT6 includes a gate electrode that receives the (4n−2)-th gate signal, a drain electrode that is electrically connected to the first node N1, and a source electrode that receives the off-voltage Voff. The seventh left transistor LT7 includes a gate electrode that is electrically connected to the first node N1, a drain electrode that receives the first clock signal L-CK, and a source electrode that receives the off-voltage Voff. The eighth left transistor LT8 includes a gate electrode that receives the second clock signal L-CKB, a drain electrode that is electrically connected to the (4n−3)-th gate line GL4n−3, and a source electrode that receives the off-voltage Voff. The drain electrode of the eighth left transistor LT8 may be electrically connected to or the same drain electrode of the sixth left transistor LT6, and the source electrode of the eighth left transistor LT8 may be electrically connected to or the same drain electrode of the sixth left transistor LT6.

When the (4n−2)-th gate signal is applied to the sixth left transistor LT6 through the gate electrode of the sixth left transistor LT6, the off-voltage Voff is applied to the first node N1, so that the first left transistor LT1 is turned off through the gate electrode of the first left transistor LT1.

When a voltage of the first node N1 is lowered to be the off-voltage Voff, the seventh left transistor LT7 is turned off via the gate electrode of the seventh left transistor LT7, so that the first clock signal L-CK is applied to the second node N2. When the first clock signal L-CK is changed from a low level to a high level, the fourth and eighth left transistors LT4 and LT8 that are electrically connected to the second node N2 are turned on, in response to the first clock signal L-CK of high level. The eighth left transistor LT8 that is turned on pulls down a voltage of the first node N1 to be the off-voltage Voff, and the fourth left transistor LT4 that is turned on applies the off-voltage to the (4n−3)-th gate line GL4n−3.

Referring to the even-numbered left stage S-LE, the ninth left transistor LT9 includes a gate electrode that is electrically connected to the third node N3, a drain electrode that receives the second clock signal L-CKB, and a source electrode that is electrically connected to the (4n−2)-th gate line GL4n−2. The tenth right transistor RT10 includes a gate electrode that receives the third clock signal R-CK, a drain electrode that is electrically connected to the (4n−2)-th gate line GL4n−2, and a source electrode that receives the off-voltage Voff. The eleventh left transistor LT11 includes a gate electrode that receives the first clock signal L-CK, a drain electrode that is electrically connected to the (4n−2)-th gate line GL4n−2, and a source electrode that receives the off-voltage Voff. It should be noted that the even numbered left stage S-LE does not require an additional transistor connecting the fourth node N4 to a gate electrode of a transistor sharing the drain and source electrodes of the eleventh transistor LT11.

The ninth left transistor LT9 outputs the second clock signal L-CKB of high level as the (4n−2)-th gate signal in response to a voltage of the third node N3. Therefore, the (4n−2)-th gate signal corresponding to the second clock signal L-CKB of high level is applied to the (4n−2)-th gate line GL4n−2.

When the third clock signal R-CK is changed from a low level to a high level, the tenth right transistor RT10 applies the off-voltage Voff to the (4n−2)-th gate line GL4n−2 in response to the third clock signal R-CK. As a result, the (4n−2)-th gate line GL4n−2 is maintained to be in a low level for 2H time.

Then, when the third clock signal R-CK is changed from a high level to a low level, the first clock signal L-CK is changed from a low level to a high level. The eleventh transistor LT11 pulls down a voltage of the (4n−2)-th gate signal to be the off-voltage Voff respectively to the first clock signal L-CK of high level. As a result, a voltage of the (4n−2)-th gate line GL4n−2 is lowered to be the off-voltage Voff.

Therefore, even when the third clock signal R-CK is changed to be a low level, the (4n−2)-th gate signal is maintained to be the off-voltage Voff for 2H time. In other words, the (4n−2)-th gate signal is maintained to be the off-voltage Voff by the first and third clock signals L-CK and R-CK having opposite phase to each other.

The twelfth left transistor LT12 includes a gate electrode, a drain electrode that is electrically connected to the gate electrode, and a source electrode that is electrically connected to the third node N3. The gate and drain electrodes of the twelfth left transistor LT12 are electrically connected to the gate line GL4n−3. The (4n−3)-th gate signal is thus applied to the gate and drain electrodes of the twelfth left transistor LT12. The third left capacitor LC3 includes a first terminal that is electrically connected to the gate electrode of the ninth left transistor LT9, and a second terminal that is electrically connected to the source electrode of the ninth left transistor LT9.

When the (4n−3)-th gate signal is applied to the third node N3 through the twelfth left transistor LT12, the ninth left transistor LT9 outputs the second clock signal L-CKB of high level as the (4n−2)-th gate signal. The second clock signal L-CKB is applied to the (4n−2)-th gate line GL4n−2.

The thirteenth left transistor LT13 includes a gate electrode that receives the (4n−1)-th gate signal, a drain electrode that is electrically connected to the third node N3, and a source electrode that receives the off-voltage Voff. The fourteenth left transistor LT14 includes a gate electrode that is electrically connected to the third node N3, a drain electrode that is electrically connected to a fourth node N4, and a source electrode that receives the off-voltage Voff. The fifteenth left transistor LT15 includes a gate electrode that is electrically connected to the fourth node N4, a drain electrode that is electrically connected to the third node N3, and a source electrode that receives the off-voltage Voff. The drain electrode of the fifteenth left transistor LT15 may be electrically connected to or may be the same drain electrode of the thirteenth left transistor LT13, and the source electrode of the fifteenth left transistor LT15 may be electrically connected to or may be the same source electrode of the thirteenth left transistor LT13.

When the (4n−1)-th gate signal is applied to the thirteenth left transistor LT13, the off-voltage Voff is applied to the third node N3, so that the ninth left transistor LT9 is turned off. When a voltage of the third node N3 is pulled down to be the off-voltage Voff, the fourteenth transistor LT14 is turned off, so that the second clock signal L-CKB is applied to the fourth node N4. When the second clock signal L-CKB is changed from a low level to a high level, the fifteenth left transistor LT15 that is electrically connected to the fourth node N4 pulls down a voltage of the third node N3 to be the off-voltage in response to the second clock signal L-CKB of high level.

As described above, by controlling the odd numbered left stage S-LO and the even numbered left stage S-LE by the third clock signal R-CK, the even numbered left stage S-LE includes only seven transistors. Therefore, a size of the first shift register 110 is decreased.

Figure 4:
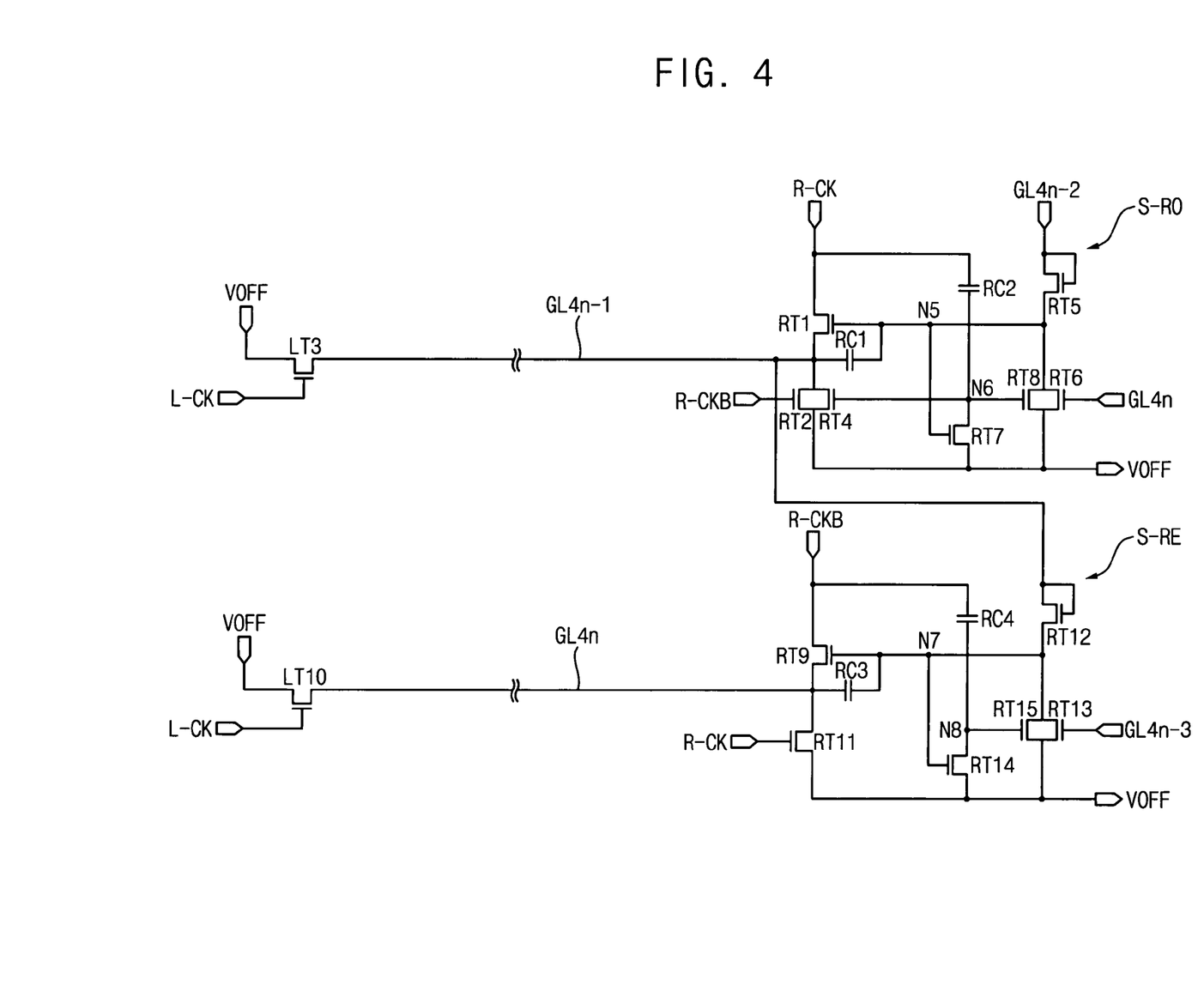
FIG. 4 is a circuit diagram of an odd-numbered right stage and an even numbered right stage in FIG. 1.

FIG. 4 is a circuit diagram of an odd-numbered right stage and an even numbered right stage in FIG. 1.

Referring to FIG. 4, it should be understood that while only one odd numbered right stage S-RO and one even numbered right stage S-RE are illustrated, the second shift register 120 may include a plurality of odd and even numbered right stages S-RO and S-RE. An odd numbered right stage S-RO includes, first, second, fourth, fifth, sixth, seventh, and eighth right transistors RT1, RT2, RT4, RT5, RT6, RT7, and RT8, and a third left transistor LT3. An even numbered right stage S-RE includes ninth, eleventh, twelfth, thirteenth, fourteenth, and fifteenth right transistors RT9, RT11, RT12, RT13, RT14, and RT15, and a tenth left transistor LT10.

The first, second, and fourth through eighth right transistors RT1, RT2, and RT4 through RT8 are electrically connected to a first end of the (4n−1)-th gate line GL4n−1, and the third left transistor LT3 is electrically connected to a second end of the (4n−1)-th gate line GL4n−1. The ninth and eleventh through fifteenth right transistors RT9, and RT11 through RT15 are electrically connected to a first end of the 4n-th gate line GL4n, and the tenth left transistor LT10 is electrically connected to a second end of the 4n-th gate line GL4n.

Referring to the odd numbered right stage S-RO, the first right transistor RT1 includes a gate electrode that is electrically connected to a fifth node N5, a drain electrode that receives the third clock signal R-CK, and a source electrode that is electrically connected to the (4n−1)-th gate line GL4n−1. The second right transistor RT2 includes a gate electrode that receives the fourth clock signal R-CKB, a drain electrode that is electrically connected to the (4n−1)-th gate line GL4n−1, and a source electrode that receives the off-voltage Voff.

The first right transistor RT1 outputs the third clock signal R-CK of high level as the (4n−1)-th gate signal via the source electrode of the first right transistor RT1 in response to a voltage of the fifth node N5. Therefore, the (4n−1)-th gate signal corresponding to the third clock signal R-CK of high level is applied to the (4n−1)-th gate line GL4n−1. The second right transistor RT2 pulls down the (4n−1)-th gate signal to be the off-voltage Voff in response to the fourth clock signal R-CKB of high level, so that the (4n−1)-th gate line GL4n−1 is lowered to be the off-voltage Voff.

The third left transistor LT3 includes a gate electrode that receives the first clock signal L-CK, a drain electrode that is electrically connected to the (4n−1)-th gate line GL4n−1, and a source electrode that receives the off-voltage Voff. The fourth right transistor RT4 includes a gate electrode that is electrically connected to a sixth node N6, a drain electrode that is electrically connected to the (4n−1)-th gate line GL4n−1, and a source electrode that receives the off-voltage Voff. The drain electrode of the fourth right transistor RT4 may be electrically connected to or may be the same drain electrode of the second right transistor RT2, and the source electrode of the fourth right transistor RT4 may be electrically connected to or may be the same drain electrode of the second right transistor RT2. The third clock signal R-CK is applied to the sixth node N6.

When the first clock signal L-CK is changed from a low level to a high level, the third left transistor LT3 applies the off-voltage to the (4n−1)-th gate line GL4n−1 in response to the first clock signal L-CK of high level. Therefore, the (4n−1)-th gate signal may be maintained to be the off-voltage Voff for 2H time. Then, when the first clock signal L-CK is changed from a high level to a low level, the third clock signal R-CK is changed from a low level to a high level. Therefore, the fourth right transistor RT4 applies the off-voltage Voff to the (4n−1)-th gate line GL4n−1 in response to the third clock signal R-CK.

As a result, even when the first clock signal L-CK is changed to be a low level, the (4n−1)-th gate signal is maintained to be the off-voltage Voff for 2H time in response to the third clock signal R-CK. In other words, the (4n−1)-th gate signal may be maintained by the first and third clock signals L-CK and R-CK having an opposite phase to each other.

The fifth right transistor RT5 includes a gate electrode, a drain electrode that is electrically connected to the gate electrode, and a source electrode that is electrically connected to the fifth node N5. The first right capacitor RC1 includes a first terminal that is electrically connected to the gate electrode of the first right transistor RT1, and a second terminal that is electrically connected to the source electrode of the first right transistor RT1.

When the (4n−2)-th gate signal is applied to the fifth node N5 through the fifth right transistor RT5, the first right transistor RT1 is turned on in response to the (4n−2)-th gate signal. As a result, the third clock signal R-CK of high level is applied to the (4n−1)-th gate line GL4n−1. In other words, the third clock signal R-CK of high level corresponds to the (4n−1)-th gate signal.

The sixth right transistor RT6 includes a gate electrode that receives the 4n-th gate signal, a drain electrode that is electrically connected to the fifth node N5, and a source electrode that receives the off-voltage Voff. The seventh right transistor RT7 includes a gate electrode that is electrically connected to fifth node N5, a drain electrode that receives the third clock signal R-CK, and a source electrode that receives the off-voltage Voff. The eighth right transistor RT8 includes a gate electrode that receives the fourth clock signal R-CKB, a drain electrode that is electrically connected to the (4n−1)-th gate line GL4n−1, and a source electrode that receives the off-voltage Voff. The drain electrode of the eighth right transistor RT8 may be electrically connected to or may be the same drain electrode of the sixth right transistor RT6, and the source electrode of the eighth right transistor RT8 may be electrically connected to or may be the same drain electrode of the sixth right transistor RT6.

When the 4n-th gate signal is applied to the sixth right transistor RT6, the off-voltage Voff is applied to the fifth node N5, so that the first right transistor RT1 is turned off.

When a voltage of the fifth node N5 is lowered to be the off-voltage Voff, the seventh right transistor RT7 is turned off, so that the third clock signal R-CK is applied to the sixth node N6. When the third clock signal R-CK is changed from a lower level to a high level, the fourth and eighth right transistors RT4 and RT8 that are electrically connected to the sixth node N6 are turned on in response to the third clock signal R-CK of high level. The eighth right transistor RT8 that is turned on lowers a voltage of the fifth node N5 to be the off-voltage Voff, and the fourth right transistor RT4 applies the off-voltage to the (4n−1)-th gate line GL4n−1.

Referring to the even numbered right stage S-RE, the ninth right transistor RT9 includes a gate electrode that is electrically connected to the seventh node N7, a drain electrode that receives the fourth clock signal R-CKB, and a source electrode that is electrically connected to the 4n-th gate line GL4n. The tenth left transistor LT10 includes a gate electrode that receives the first clock signal L-CK, a drain electrode that is electrically connected to the fourth gate line GL4n, and a source electrode that receives the off-voltage Voff. The eleventh right transistor RT11 includes a gate electrode that receives the third clock signal R-CK, a drain electrode that is electrically connected to the 4n-th gate line GL4n, and a source electrode that receives the off-voltage Voff. It should be noted that the even numbered right stage S-RE does not require an additional transistor connecting the eighth node N8 to a gate electrode of a transistor sharing the drain and source electrodes of the eleventh transistor RT11.

The ninth right transistor RT9 outputs the fourth clock signal R-CKB as a 4n-th gate signal in response to a voltage of the seventh node N7. Therefore, the 4n-th gate signal corresponding to the fourth clock signal R-CKB is applied to the 4n-th gate line GL4n.

When the first clock signal L-CK is changed from a high level to a low level, the tenth left transistor LT10 applies the off-voltage Voff to the 4n-th gate line GL4n in response to the first clock signal L-CK of high level. Therefore, the 4n-th gate signal is maintained to be a high level for 1H time, and then maintained to be a low level by the first clock signal L-CK for 2H time.

When the first clock signal L-CK is changed from a high level to a low level, the third clock signal R-CK is changed from a low level to a high level. The eleventh right transistor RT11 lowers the 4n-th gate signal to be the off-voltage Voff in response to the third clock signal R-CK of high level, so that the 4n-th gate line GL4n is lowered to be the off-voltage Voff.

As a result, even when the first clock signal L-CK is changed to be a low level, the 4n-th gate signal may be maintained to be the off-voltage Voff in response to the third clock signal R-CK for 2H time. In other words, the 4n-th gate signal is maintained to be the off-voltage Voff by the first and third clock signals L-CK and R-CK having an opposite phase to each other.

The twelfth right transistor RT12 includes a gate electrode, a drain electrode that is electrically connected to the gate electrode, and a source electrode that is electrically connected to a seventh node N7. The gate electrode and the drain electrode of the twelfth right transistor RT12 are electrically connected to the gate line GL4n−1. The third right capacitor RC3 includes a first terminal that is electrically connected to the gate electrode of the ninth right transistor RT9, and a second terminal that is electrically connected to the source electrode of the ninth right transistor RT9.

When the (4n−1)-th gate signal is applied to the seventh node N7 through the twelfth right transistor RT12, the ninth right transistor RT9 applies the fourth clock signal R-CKB of high level to the 4n-th gate line GL4n in response to the (4n−1)-th gate signal. That is, the fourth clock signal R-CKB of high level corresponds to the 4n-th gate signal.

The thirteenth right transistor RT13 includes a gate electrode that receives the (4n−3)-th gate signal, a drain electrode that is electrically connected to the seventh node N7, and a source electrode that receives the off-voltage Voff. The fourteenth right transistor RT14 includes a gate electrode that is electrically connected to the seventh node N7, a drain electrode that is electrically connected to the eighth node N8, and a source electrode that receives the off-voltage Voff. The fifteenth right transistor RT15 includes a gate electrode that is electrically connected to the eighth node N8, a drain electrode that is electrically connected to the seventh node N7, and a source electrode that receives the off-voltage Voff. The drain electrode of the fifteenth right transistor RT15 may be electrically connected to or may be the same drain electrode of the thirteenth right transistor RT13, and the source electrode of the fifteenth right transistor RT15 may be electrically connected to or may be the same drain electrode of the thirteenth right transistor RT13. When the (4n−3)-th gate signal is applied to the gate electrode of the thirteenth right transistor RT13, the off-voltage Voff is applied to the seventh node N7, so that the ninth right transistor RT9 is turned off via the gate electrode of the ninth right transistor RT9. When the seventh node N7 is lowered to be the off-voltage Voff, the fourteenth right transistor RT14 is turned off via the gate electrode of the fourteenth right transistor RT14, so that the fourth clock signal R-CKB is applied to the eighth node N8. When the fourth clock signal R-CKB is changed from a low level to a high level, the fifteenth right transistor RT15 that is electrically connected to the eighth node N8 lowers a voltage of the seventh node N7 to be the off-voltage Voff in response to the fourth clock signal R-CKB of high level.

As shown above, by controlling the odd numbered right stage S-RO and the even numbered right stage S-RE through the first clock signal L-CK, the even numbered right stage S-RE may include only seven transistors. Therefore, a size of the second shift register 120 is reduced.

Figure 5:
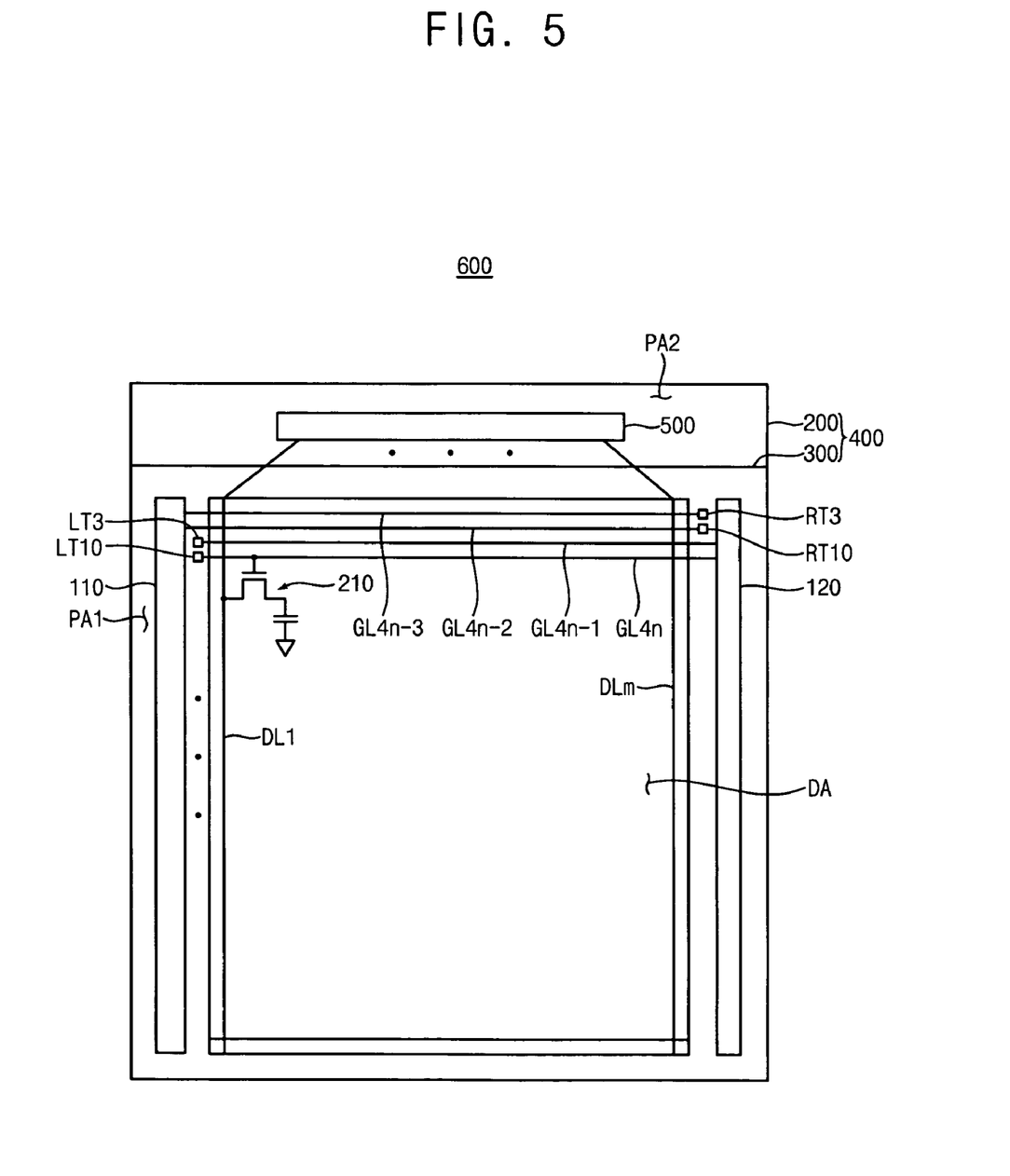
FIG. 5 is a schematic plan view illustrating an exemplary embodiment of an LCD device having the gate driver circuit in FIG. 1.

FIG. 5 is a schematic plan view illustrating an LCD device having the gate driver circuit in FIG. 1.

Referring to FIGS. 1 and 5, a liquid crystal display ("LCD") device 600 includes a display panel 400, a gate driver circuit 100, and a data driver chip 500. The display panel 400 displays an image, and the gate driver circuit 100 and the data driver chip 500 drive the display panel 400.

The display panel 400 includes an array substrate 200, a color filter substrate 300 facing the array substrate 200, and a liquid crystal layer (not shown) disposed between the array substrate 200 and the color filter substrate 300. The display panel 400 includes a display region DA, a first peripheral region PA1, and a second peripheral region PA2. The first peripheral region PA1 surrounds the display region DA. The second peripheral region PA2 is adjacent to the first peripheral region PA1.

The array substrate 200 includes a plurality of gate lines GL4n−3, GL4n−2, GL4n−1, and GL4n, and a plurality of data lines DL1, DL2, . . . , DLm. It should be understood that while only four gate lines and two data lines are illustrated, a plurality of similar gate lines and data lines may be provided in the array substrate 200. The gate lines GL4n−3, GL4n−2, GL4n−1, and GL4n, and the data lines DL1, DL2, . . . , DLm are disposed within the display region DA. The gate lines GL4n−3, GL4n−2, GL4n−1 and GL4n are electrically insulated from the data lines DL1, DL2, . . . , DLm. The gate lines GL4n−3, GL4n−2, GL4n−1 and GL4n are extended along a first direction, and the data lines DL1, DL2, . . . , DLm are extended along a second direction that is substantially perpendicular to the first direction. The thin film transistor ("TFT") 210 and a pixel electrode (not shown) are formed in a region defined by two adjacent gate lines and two adjacent data lines. The TFT 210 includes a gate electrode that is electrically connected to one of the gate lines GL4n−3, GL4n−2, GL4n−1, and GL4n, and a source electrode that is electrically connected to one of the data lines DL1, DL2, . . . , DLm. The pixel electrode further includes a drain electrode that is electrically connected to the TFT 210.

The gate driver circuit 100 includes the first and second shift registers 110 and 120. A majority of transistors in the first shift register 110 is disposed in the first peripheral region PA1 such that the majority of the transistors in the first shift register 110 are adjacent to the first end of the gate lines GL4n−3, GL4n−2, GL4n−1, and GL4n. A majority of transistors in the second shift register 120 is disposed in the first peripheral region PA1 such that the majority of the transistors in the second shift register 120 are adjacent to the second end of the gate lines GL4n−3, GL4n−2, GL4n−1, and GL4n.

The first and second clock wirings CL1 and CL2 transferring the first and second clock signals L-CK and L-CKB, respectively, are adjacent to the first shift register 110. The third and fourth clock wirings CL3 and CL4 transferring the third and fourth clock signals R-CK and R-CKB, respectively, are adjacent to the second shift register 120.

The third and tenth right transistors RT3 and RT10 of the first shift register 110, which receive the third clock signal R-CK, are adjacent to the portion of the second shift register 120 adjacent the third and fourth clock wirings CL3 and CL4. The third and tenth left transistors LT3 and LT10 of the second shift register 120, which receive the first clock signal L-CK, are adjacent to the portion of the first shift register 110 adjacent the first and second clock wirings CL1 and CL2.

The first shift register 110 applies the (4n−3)-th gate signal and the (4n−2)-th gate signal to the (4n−3)-th gate line GL4n−3 and the (4n−2)-th gate line GL4n−2, respectively. Then, the second shift register 120 applies the (4n−1)-th gate signal and the 4n-th gate signal to the (4n−1)-th gate line GL4n−1 and the 4n-th gate line GL4n, respectively. As described above, the first and second shift registers 110 and 120 alternately output gate signals by two-line units to drive the gate lines GL4n−3, GL4n−2, GL4n−1, and GL4n.

The data driver chip 500 is mounted on the second peripheral region PA2 of the array substrate 200. The data driver chip 500 is electrically connected to the data lines DL1, DL2, . . . , DLm. The data driver chip 500 applies data signals to the data lines DL1, DL2, . . . , DLm.

According to the gate driver circuit and the display device of the present invention, the first shift register is driven by the first through the third clock signals, and the second shift register is driven by the first, third, and fourth clock signals.

As a result, a number of transistors within the first and second shift registers may be decreased to reduce a size of the first and second shift registers.

Additionally, the transistor of the first shift register, which receives the third clock signal, is disposed adjacent to the second shift register at a second end of the gate lines, and the transistor of the second shift register, which receives the first clock signal, is disposed adjacent to the first shift register at a first end of the gate lines.

As a result, a space of the array substrate may be used efficiently, so that an area of the array substrate, where the gate driver circuit is formed, may be reduced.

Having described the exemplary embodiments of the present invention and its advantages, it is noted that various changes, substitutions and alterations can be made herein without departing from the spirit and scope of the invention as defined by appended claims. Moreover, the use of the terms first, second, etc. do not denote any order or importance, but rather the terms first, second, etc. are used to distinguish one element from another. Furthermore, the use of the terms a, an, etc. do not denote a limitation of quantity, but rather denote the presence of at least one of the referenced item.

What is claimed is:

1. A gate driver circuit comprising:
   a first shift register including a plurality of first stages, the first shift register applying a (4n−3)-th gate signal and a (4n−2)-th gate signal to a (4n−3)-th gate line and a (4n−2)-th gate line, respectively, in response to a first clock signal, a second clock signal, and a third clock signal, the second clock signal having a delayed phase by 1H time with respect to the first clock signal, and the third clock signal having opposite phase to the first clock signal; and
   a second shift register including a plurality of second stages, the second shift register applying a (4n−1)-th gate signal and a 4n-th gate signal to a (4n−1)-th gate line and a 4n-th gate line, respectively, in response to the first clock signal, the third clock signal, and a fourth clock signal, the fourth clock signal having opposite phase to the second clock signal, wherein n is a natural number.

2. The gate driver circuit of claim 1, wherein odd numbered stages in the first stages apply the first clock signal of high level to the (4n−3)-th gate line, lower a voltage of the (4n−3)-th gate line to be an off-voltage in response to the second clock signal, hold the voltage of the (4n−3)-th gate line to be off-voltage in response to the third clock signal, and hold the voltage of the (4n−3)-th gate signal to be the off-voltage in response to the first clock signal, and
   even numbered stages in the first stages apply the second clock signal of high level to the (4n−2)-th gate line, lower a voltage of the (4n−2)-th gate line to be off-voltage in response to the third clock signal, and hold the voltage of the (4n−2)-th gate line to be off-voltage in response to the first clock signal.

3. The gate driver circuit of claim 2, wherein odd numbered stages in the first stages apply the first clock signal of high level to the (4n−3)-th gate line for 1H time, lower a voltage of the (4n−3)-th gate line to be an off-voltage for 1H time in response to the second clock signal, hold the voltage of the (4n−3)-th gate line to be off-voltage for 2H time in response to the third clock signal, and hold the voltage of the (4n−3)-th gate signal to be the off-voltage for 2H time in response to the first clock signal, and even numbered stages in the first stages apply the second clock signal of high level to the (4n−2)-th gate line for 1H time, lower a voltage of the (4n−2)-th gate line to be off-voltage for 2H time in response to the third clock signal, and hold the voltage of the (4n−2)-th gate line to be off-voltage for 2H time in response to the first clock signal.

4. The gate driver circuit of claim 2, wherein each of the odd numbered stages in the first stages comprises:
a first left transistor applying the first clock signal of high level to the 4n-3-th gate line;
a second left transistor lowering a voltage of the (4n−3)-th gate line to be the off-voltage in response to the second clock signal of high level;
a third right transistor holding the voltage of the (4n−3)-th gate line to be the off-voltage in response to the third clock signal of high level; and
a fourth left transistor holding the voltage of the (4n−3)-th gate line to be the off-voltage in response to the first clock signal of high level.

5. The gate driver circuit of claim 4, wherein each of the odd numbered stages in the first stages further comprises:
a first left capacitor having a first terminal electrically connected to a gate electrode of the first left transistor, and a second terminal electrically connected to a source electrode of the first left transistor;
a fifth left transistor electrically charging the first left capacitor in response to a scan start signal or the 4n-th gate signal;
a sixth left transistor turning off the first left transistor in response to the (4n−2)-th gate signal;
a seventh left transistor lowering the first clock signal to be the off-voltage in response to the scan start signal or the 4n-th gate signal; and
an eighth left transistor turning off the first left transistor in response to the first clock signal.

6. The gate driver circuit of claim 5, wherein the first, second, and fourth through eighth left transistors are adjacent to a first end of the (4n−3)-th gate line, and the third right transistor is adjacent to a second end of the (4n−3)-th gate line.

7. The gate driver circuit of claim 2, wherein each of the even numbered stages in the first stages comprises:
a ninth left transistor applying the second clock signal of high level to the (4n−2)-th gate line;
a tenth right transistor lowering a voltage of the (4n−2)-th gate line to be the off-voltage in response to the third clock signal of high level; and
an eleventh left transistor holding the voltage of the (4n−2)-th gate line to be the off-voltage in response to the first clock signal of high level.

8. The gate driver circuit of claim 7, wherein each of the even numbered stages in the first stages further comprises:
a second left capacitor including a first terminal electrically connected to a gate electrode of the ninth left transistor and a second terminal electrically connected to a source electrode of the ninth left transistor, the second left capacitor turning on the ninth left transistor;
a twelfth left transistor electrically charging the second left transistor in response to the (4n−3)-th gate signal;
a thirteenth left transistor turning off the ninth left transistor in response to the (4n−1)-th gate signal;
a fourteenth left transistor lowering the second clock signal to be the off-voltage in response to the (4n−3)-th gate signal; and
a fifteenth left transistor turning off the ninth left transistor in response to the second clock signal.

9. The gate driver circuit of claim 8, wherein the ninth and eleventh through fifteenth left transistors are adjacent to a first end of the (4n−2)-th gate line, and the tenth right transistor is adjacent to a second end of the (4n−2)-th gate line.

10. The gate driver circuit of claim 1, wherein odd numbered stages in the second stages apply the third clock signal of high level to the (4n−1)-th gate line, lower a voltage of the (4n−1)-th gate line to be an off-voltage in response to the fourth clock signal, hold the voltage of the (4n−1)-th gate line to be off-voltage in response to the first clock signal, and hold the voltage of the (4n−1)-th gate signal to be the off-voltage in response to the third clock signal, and even numbered stages in the second stages apply the fourth clock signal of high level to the 4n-th gate line, lower a voltage of the 4n-th gate line to be off-voltage in response to the first clock signal, and hold the voltage of the 4n-th gate line to be off-voltage in response to the third clock signal.

11. The gate driver circuit of claim 10, wherein odd numbered stages in the second stages apply the third clock signal of high level to the (4n−1)-th gate line for 1H time, lower a voltage of the (4n−1)-th gate line to be an off-voltage for 1H time in response to the fourth clock signal, hold the voltage of the (4n−1)-th gate line to be off-voltage for 2H time in response to the first clock signal, and hold the voltage of the (4n−1)-th gate signal to be the off-voltage for 2H time in response to the third clock signal, and even numbered stages in the second stages apply the fourth clock signal of high level to the 4n-th gate line for 1H time, lower a voltage of the 4n-th gate line to be off-voltage for 2H time in response to the first clock signal, and hold the voltage of the 4n-th gate line to be off-voltage for 2H time in response to the third clock signal.

12. The gate driver circuit of claim 10, wherein each of the odd numbered stages in the second stages, comprises:
a first right transistor applying the third clock signal of high level to the (4n−1)-th gate lines;
a second right transistor lowering a voltage of the (4n−1)-th gate line to be the off-voltage in response to the fourth clock signal of high level;
a third left transistor holding the voltage of the (4n−1)-th gate line to be the off-voltage in response to the first clock signal of high level; and
a fourth right transistor holding the voltage of the (4n−1)-th gate line to be the off-voltage in response to the third clock signal of high level.

13. The gate driver circuit of claim 12, wherein each of the odd numbered stages in the second stages, further comprises:
a first right capacitor having a first terminal electrically connected to a gate electrode of the first right transistor, and a second terminal electrically connected to a source electrode of the first right transistor;
a fifth right transistor electrically charging the first right capacitor in response to a scan start signal or the (4n−2)-th gate signal;

a sixth right transistor turning off the first right transistor in response to the 4n-th gate signal;

a seventh right transistor lowering the third clock signal to be the off-voltage in response to the scan start signal or the (4n−2)-th gate signal; and an eighth right transistor turning off the first right transistor in response to the third clock signal.

14. The gate driver circuit of claim 13, wherein the first, second, and fourth through eighth right transistors are adjacent to a first end of the (4n−1)-th gate line, and the third left transistor is adjacent to a second end of the (4n−1)-th gate line.

15. The gate driver circuit of claim 10, wherein each of the even numbered stages in the second stages comprises:

a ninth right transistor applying the fourth clock signal of high level to the 4n-th gate line;

a tenth left transistor lowering a voltage of the 4n-th gate line to be the off-voltage in response to the first clock signal of high level; and an eleventh right transistor holding the voltage of the 4n-th gate line to be the off-voltage in response to the third clock signal of high level.

16. The gate driver circuit of claim 15, wherein each of the even numbered stages in the second stages further comprises:

a second right capacitor including a first terminal electrically connected to a gate electrode of the ninth right transistor and a second terminal electrically connected to a source electrode of the ninth right transistor, the second right capacitor turning on the ninth right transistor;

a twelfth right transistor electrically charging the second right transistor in response to the (4n−1)-th gate signal;

a thirteenth right transistor turning off the ninth right transistor in response to the (4n−3)-th gate signal;

a fourteenth right transistor lowering the fourth clock signal to be the off-voltage in response to the (4n−1)-th gate signal; and a fifteenth right transistor turning off the ninth right transistor in response to the fourth clock signal.

17. The gate driver circuit of claim 16, wherein the ninth and eleventh through fifteenth right transistors are adjacent to a first end of the 4n-th gate line, and the tenth left transistor is adjacent to a second end of the 4n-th gate line.

18. The gate driver circuit of claim 1, wherein the first through fourth clock signals have a 4H time period, and the first through fourth clock signals are high for 2H time and low for 2H time.

19. The gate driver circuit of claim 1, wherein the first shift register is disposed at a first end of the (4n−3)-th through 4n-th gate lines, and the second shift register is disposed at a second end of the (4n−3)-th through 4n-th gate lines.

20. The gate driver circuit of claim 19, further comprising a first clock wiring transferring the first clock signal, a second clock wiring transferring the second clock signal, a third clock wiring transferring the third clock signal, and a fourth clock wiring transferring the fourth clock signal, wherein the first and second clock wirings are adjacent to the first shift register and third and fourth clock wirings are adjacent to the second shift register.

21. The gate driver circuit of claim 20, wherein the first shift register includes a first shift register group operating in response to the third clock signal and adjacent to the third clock wiring, and the second shift register includes a second shift register group operating in response to the first clock signal and adjacent to the first clock wiring.

22. The gate driver circuit of claim 1, wherein even numbered stages of the plurality of first and second stages include less transistors than odd numbered stages of the plurality of first and second stages.

23. A display device comprising:

a display panel displaying an image in response to a gate signal and a data signal;

a gate driver circuit outputting the gate signal; and a data driver circuit outputting the data signal, wherein the gate driver circuit includes:

a first shift register including a plurality of first stages, the first shift register applying a (4n−3)-th gate signal and a (4n−2)-th gate signal to a (4n−3)-th gate line and a (4n−2)-th gate line, respectively, in response to a first clock signal, a second clock signal, and a third clock signal, the second clock signal having a delayed phase by 1H time with respect to the first clock signal, and the third clock signal having opposite phase to the first clock signal; and a second shift register including a plurality of second stages, the second shift register applying a (4n−1)-th gate signal and a 4n-th gate signal to a (4n−1)-th gate line and a 4n-th gate line, respectively, in response to the first clock signal, the third clock signal, and a fourth clock signal, the fourth clock signal having opposite phase to the second clock signal, wherein n is a natural number.

24. The display device of claim 23, wherein the display panel includes an array substrate having a (4n−3)-th gate line, a (4n−2)-th gate line, a (4n−1)-th gate line, and a 4n-th gate line, the first shift register adjacent to a first end of the (4n−3)-th gate line, the (4n−2)-th gate line, the (4n−1)-th gate line, and the 4n-th gate line, and the second shift register adjacent to a second end of the (4n−3)-th gate line, the (4n−2)-th gate line, the (4n−1)-th gate line, and the 4n-th gate line.

25. The display device of claim 24, wherein the first shift register includes a transistor adjacent the second end of the (4n−3)-th gate line and a transistor adjacent the second end of the (4n−2)-th gate line.

26. The display device of claim 25, wherein the second shift register includes a transistor adjacent the first end of the (4n−1)-th gate line and a transistor adjacent the first end of the 4n-th gate line.

27. The display device of claim 24, wherein the gate driver circuit further comprises a first clock wiring transferring the first clock signal, a second clock wiring transferring the second clock signal, a third clock wiring transferring the third clock signal, and a fourth clock wiring transferring the fourth clock signal, the first and second clock wirings adjacent to the first shift register, and third and fourth clock wirings adjacent to the second shift register.

28. The display device of claim 27, wherein the first shift register includes a first shift register group operating in response to the third clock signal and adjacent to the third clock wiring, and the second shift register includes a second shift register group operating in response to the first clock signal and adjacent to the first clock wiring.

29. A display device comprising:

a display panel including a plurality of gate lines each having a first end and a second end;

a first shift register responding to a first clock signal and a second clock signal on the first end of the gate lines, and responding to a third clock signal on the second end of the gate lines; and, a second shift register responding to the third clock signal and a fourth clock signal on the second end of the gate lines, and responding to the first clock signal on the first end of the gate lines.

30. The display device of claim 29, wherein the first shift register includes a plurality of first stages, each first stage including a plurality of transistors responding to the first and second clock signals and each first stage including only one transistor responding to the third clock signal.

31. The display device of claim 30, wherein the second shift register includes a plurality of second stages, each second stage including a plurality of transistors responding to the third and fourth clock signals and each second stage including only one transistor responding to the first clock signal.

32. The display device of claim 29, wherein the first shift register includes at least one odd numbered stage and one even numbered stage, and the second shift register includes at least one odd numbered stage and one even numbered stage, the even numbered stages of the first and second shift registers including less transistors than the odd numbered stages of the first and second shift registers.

33. The display device of claim 29, wherein the second clock signal has a delayed phase by 1H time with respect to the first clock signal, the third clock signal has an opposite phase with respect to the first clock signal, and the fourth clock signal has an opposite phase with respect to the second clock signal.

* * * * *